US009485886B2

(12) United States Patent
Fu

(10) Patent No.: US 9,485,886 B2
(45) Date of Patent: Nov. 1, 2016

(54) DRIVE MODULE, SERVER MECHANISM AND CONTAINING FRAME THEREOF

(71) Applicant: Wistron Corporation, New Taipei (TW)

(72) Inventor: Zhao-Ping Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 76 days.

(21) Appl. No.: 14/697,650

(22) Filed: Apr. 28, 2015

(65) Prior Publication Data
US 2016/0050787 A1    Feb. 18, 2016

(30) Foreign Application Priority Data

Aug. 13, 2014 (CN) .......................... 2014 1 0399951

(51) Int. Cl.
*H05K 7/14* (2006.01)
*G06F 1/18* (2006.01)

(52) U.S. Cl.
CPC .............. *H05K 7/1489* (2013.01); *H05K 7/14* (2013.01); *G06F 1/187* (2013.01)

(58) Field of Classification Search
CPC .... H05K 7/14; H05K 7/1422; H05K 7/1427; H05K 7/1445; H05K 7/1487; H05K 2201/10189; H05K 3/284; H05K 3/3447; H05K 1/141; H05K 3/3452; H05K 7/1411; H05K 7/1409; G06F 1/1601; G06F 1/187; G06F 13/409; G06F 1/16; G06F 1/1613; G06F 1/181; G06F 1/184; G06F 1/183; G06F 1/185; G06F 1/1616; G06F 1/186; G06F 1/188; G11B 33/128; G11B 33/124; G11B 25/043; H01L 2924/19041; H01L 2924/01079; H01L 2924/01006; H01L 2224/48091; G02B 6/42246; H04M 1/0262
USPC ....... 361/724–727, 730, 736, 737, 748, 754, 361/728, 679.32–679.39; 312/223.1–223.2
See application file for complete search history.

(56) References Cited

U.S. PATENT DOCUMENTS 5,673,172 A * 9/1997 Hastings .............. H05K 7/1418
                                                            361/679.34
8,437,127 B2    5/2013 Wang

* cited by examiner

*Primary Examiner* — Anthony Haughton
*Assistant Examiner* — Ingrid Wright
(74) *Attorney, Agent, or Firm* — Winston Hsu; Scott Margo

(57) ABSTRACT

A drive module is inserted into an extraction opening of a server and includes a casing, a circuit board, a fixing member fixed on the casing, a plurality of drives, and a cover having a clamping portion and forming a space cooperatively with the casing. The fixing member has engaging and pressing arms. The engaging arm is engaged with the circuit board when the clamping portion and the casing clamp the circuit board. The pressing arm has a hole for engaging with a protruding portion of the server to fix the drive module. The plurality of drives is inserted into the space and plugged into the circuit board. When the pressing arm is pulled toward a first direction or a second direction opposite to the first direction, the hole is disengaged from the protruding portion or the pressing arm drives the engaging arm to be separate from the circuit board.

20 Claims, 6 Drawing Sheets

DRIVE MODULE, SERVER MECHANISM AND CONTAINING FRAME THEREOF

BACKGROUND OF THE INVENTION

1. Field of the Invention

The present invention relates to a drive module, a server mechanism, and a containing frame thereof, and more specifically, to a drive module, a server mechanism, and a containing frame thereof for modularizing a plurality of drives.

2. Description of the Prior Art

In general, there is usually a disk drive (e.g. a hard disk drive or a solid state disk drive) disposed on a server for a user to perform data access and update operations of the server. The conventional configuration is to assemble the disk drive in an extraction opening of the server. However, if the user wants to replace a large-size disk drive (e.g. a hard disk drive) originally assembled in the extraction opening of the server with plural small-size disk drives (e.g. solid state disk drives), the problem may occur that the overall size of the small-scale disk drives does not fit the size of the large-size disk drive since the small-size disk drives are not modularized. The aforesaid problem could make the user fail to perform the drive replacement operation of the server, and could reduce efficiency in use of space of the extraction opening. Thus, it may cause the user much inconvenience in the drive replacement operation of the server.

SUMMARY OF THE INVENTION

The present invention provides a drive module detachably inserted into an extraction opening of a server. The server has a first positioning portion formed in the extraction opening. The drive module includes a casing, a circuit board, a cover, a fixing member, and a plurality of drives. The circuit board abuts against an end portion of the casing. The cover is disposed on the casing for forming a containing space cooperatively with the casing. The cover has a clamping portion formed thereon. The fixing member is fixed on the casing. The fixing member has at least one engaging arm and a pressing arm. The at least one engaging arm is engaged with the circuit board for fixing the circuit board on the end portion of the casing when the clamping portion and the end portion of the casing clamp the circuit board cooperatively. A second positioning portion is formed on the pressing arm for engaging with the first positioning portion to fix the drive module in the extraction opening. The plurality of drives is inserted into the containing space and plugged into the circuit board. When the pressing arm is pulled toward a first direction relative to the casing, the second positioning portion is disengaged from the first positioning portion to make the drive module detachably extracted from the extraction opening. When the puling arm is pulled toward a second direction, the pressing arm drives the engaging arm to be separate from the circuit board. The first direction is opposite to the second direction.

The present invention further provides a server mechanism including a server and a drive module. The server has an extraction opening and a first positioning portion formed in the extraction opening. The drive module is detachably inserted into the extraction opening of the server. The drive module includes a casing, a circuit board, a cover, a fixing member, and a plurality of drives. The circuit board abuts against an end portion of the casing. The cover is disposed on the casing for forming a containing space cooperatively with the casing. The cover has a clamping portion formed thereon. The fixing member is fixed on the casing. The fixing member has at least one engaging arm and a pressing arm. The at least one engaging arm is engaged with the circuit board for fixing the circuit board on the end portion of the casing when the clamping portion and the end portion of the casing clamp the circuit board cooperatively. A second positioning portion is formed on the pressing arm for engaging with the first positioning portion to fix the drive module in the extraction opening. The plurality of drives is inserted into the containing space and plugged into the circuit board. When the pressing arm is pulled toward a first direction relative to the casing, the second positioning portion is disengaged from the first positioning portion to make the drive module detachably extracted from the extraction opening. When the puling arm is pulled toward a second direction, the pressing arm drives the engaging arm to be separate from the circuit board. The first direction is opposite to the second direction.

The present invention further provides a containing frame detachably inserted into an extraction opening of a server for containing a plurality of drives. The plurality of drives is plugged into a circuit board. The server has a first positioning portion formed in the extraction opening. The containing frame includes a casing, a cover, and a fixing member. The circuit board abuts against an end portion of the casing. The cover is disposed on the casing for forming a containing space cooperatively with the casing. The cover has a clamping portion formed thereon. The fixing member is fixed on the casing. The fixing member has at least one engaging arm and a pressing arm. The at least one engaging arm is engaged with the circuit board for fixing the circuit board on the end portion of the casing when the clamping portion and the end portion of the casing clamp the circuit board cooperatively. A second positioning portion is formed on the pressing arm for engaging with the first positioning portion to fix the drive module in the extraction opening. When the pressing arm is pulled toward a first direction relative to the casing, the second positioning portion is disengaged from the first positioning portion to make the containing frame with the plurality of drives detachably extracted from the extraction opening. When the puling arm is pulled toward a second direction, the pressing arm drives the engaging arm to be separate from the circuit board. The first direction is opposite to the second direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
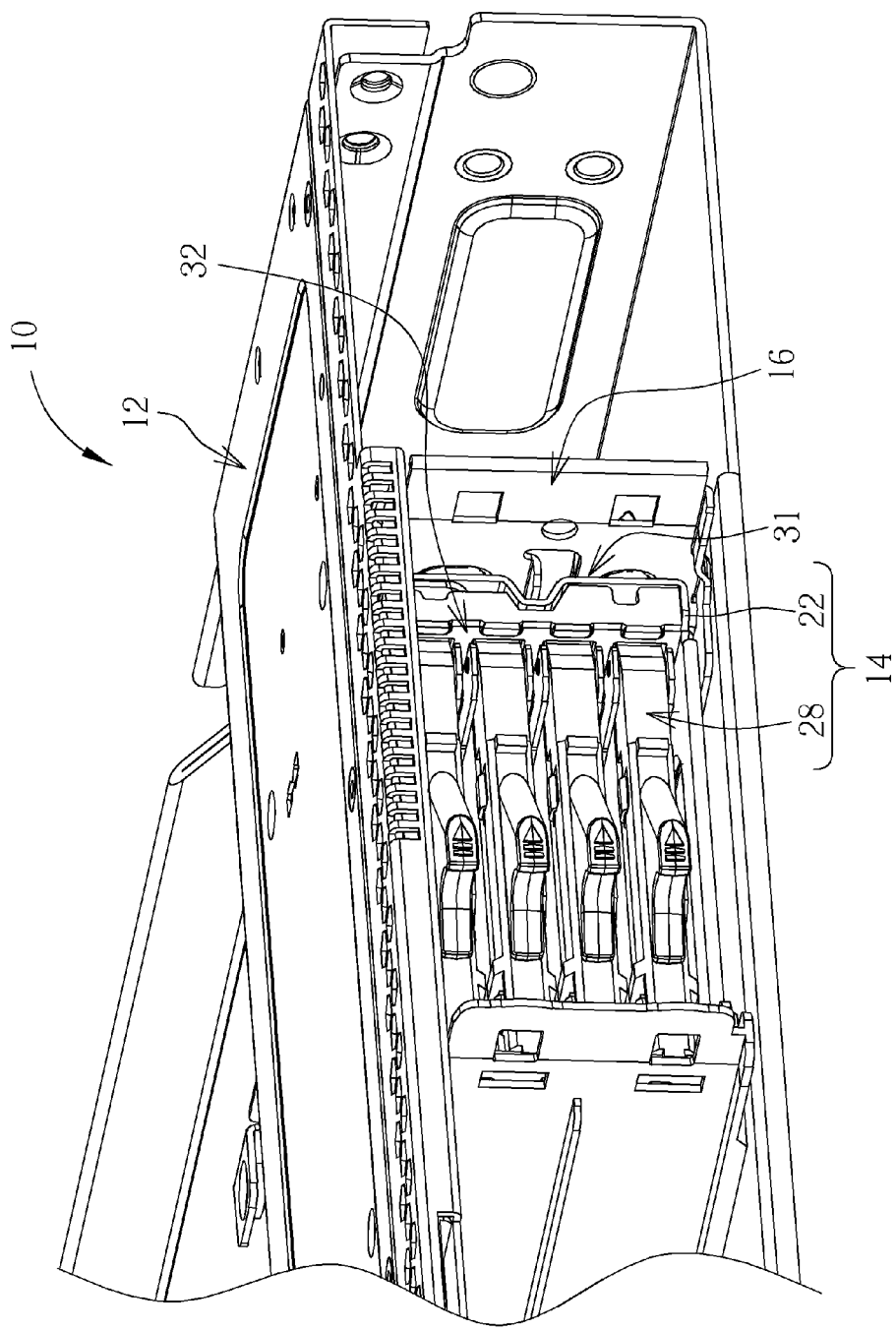
FIG. 1 is a partial enlarged diagram of a server mechanism according to an embodiment of the present invention.
Figure 2:
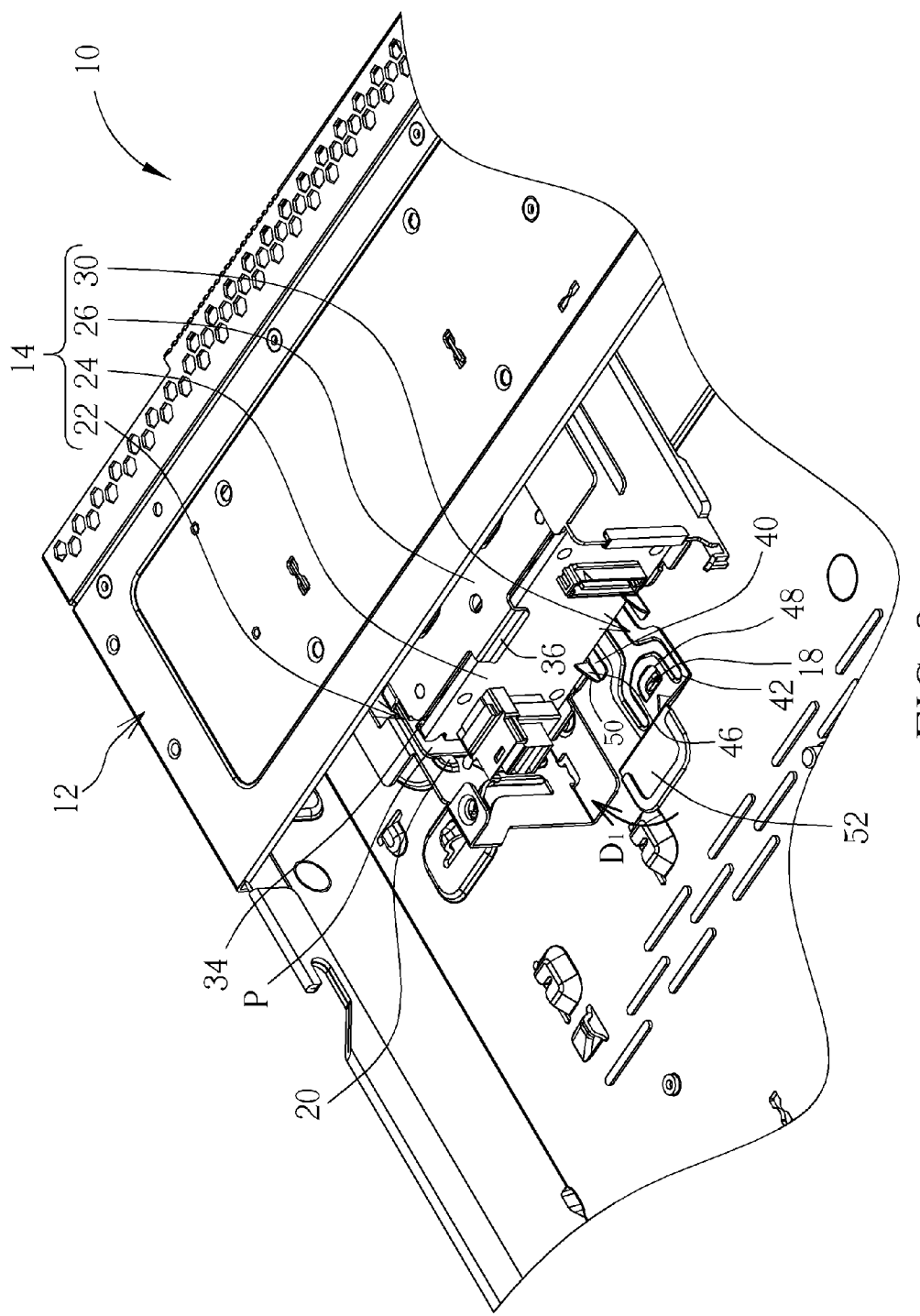
FIG. 2 is an internal diagram of the server mechanism in FIG. 1.

Please refer to FIG. 1 and FIG. 2. FIG. 1 is a partial enlarged diagram of a server mechanism 10 according to an embodiment of the present invention. FIG. 2 is an internal diagram of the server mechanism 10 in FIG. 1. As shown in FIG. 1 and FIG. 2, the server mechanism 10 includes a server 12 (briefly depicted by a part of its casing in FIG. 1 and FIG. 2) and a drive module 14. The server 12 has an extraction opening 16 for a user to perform the drive assembly and disassembly processes of the server mechanism 10. The server 12 further has a first positioning portion 18 formed in the extraction opening 16 for positioning the drive module 14. A protruding block 20 is further formed in the extraction opening 16 for constraining inward movement of the drive module 14 relative to the extraction opening 16 when the drive module 14 is inserted into the extraction opening 16, so as to prevent the drive module 14 from interfering with or colliding with other components in the server 12.

Figure 3:
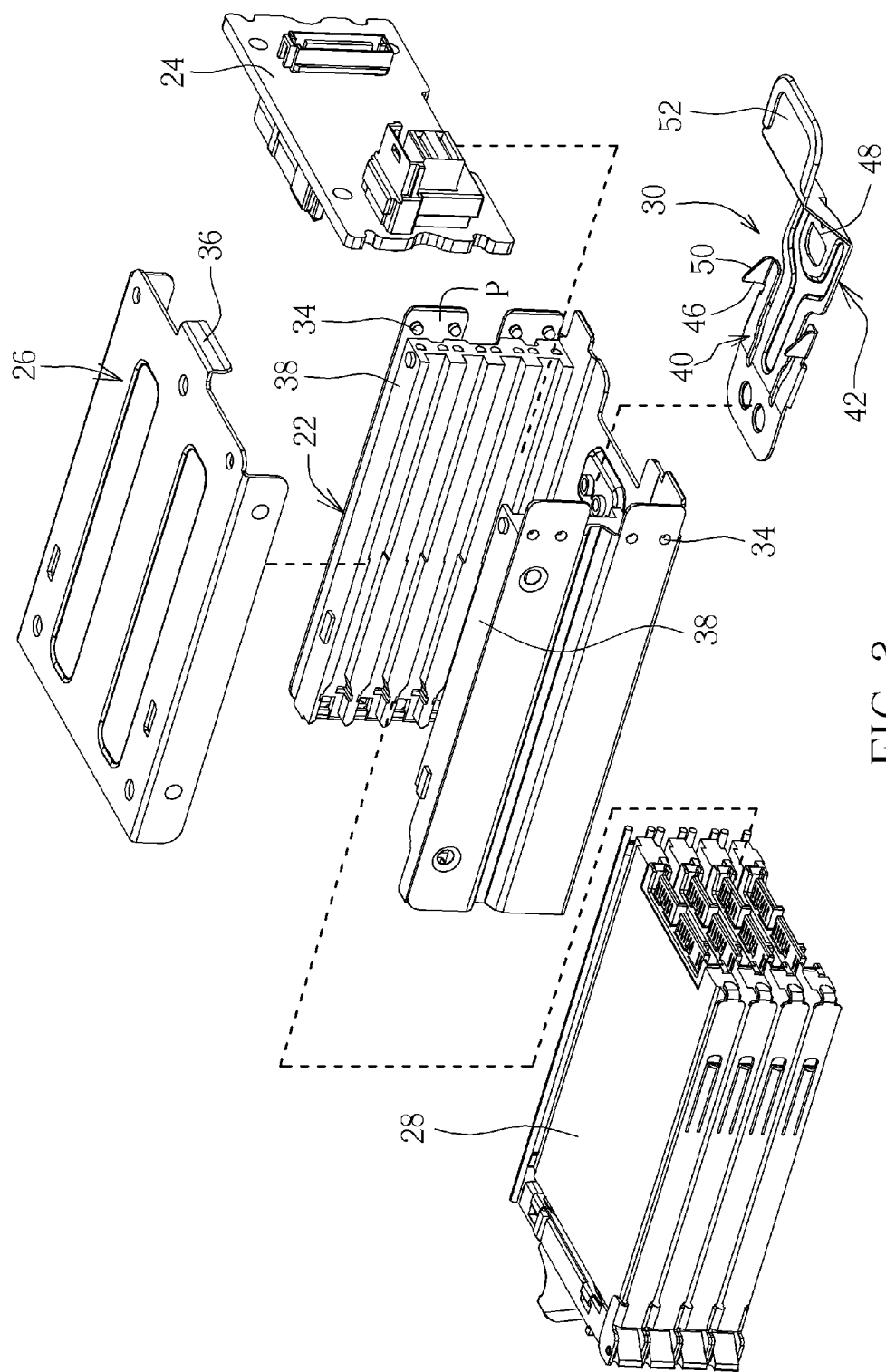
FIG. 3 is an exploded diagram of a drive module in FIG. 1.

Please refer to FIG. 1, FIG. 2, and FIG. 3. FIG. 3 is an exploded diagram of the drive module 14 in FIG. 1. As shown in FIG. 1, FIG. 2, and FIG. 3, the drive module 14 is detachably inserted into the extraction opening 16 of the server 12. The drive module 14 includes a casing 22, a circuit board 24, a cover 26, a plurality of drives 28 (four shown in FIG. 3, but not limited thereto), and a fixing member 30. The cover 26 is disposed on the casing 22 for constructing a containing frame 31 cooperatively with the casing 22 and the fixing member 30 so as to form a containing space 32 for containing the drives 28. Furthermore, the casing 22 and the cover 26 could adopt a conventional clamping design to fix the circuit board 24 between the casing 22 and the cover 26. For example, in this embodiment, an end portion P of the casing 22 could have at least one protruding portion 34 (eight shown in FIG. 3, but not limited thereto) formed thereon, and a clamping portion 36 could extend from the cover 26. Accordingly, when the circuit board 24 vertically abuts against the protruding portions 34 on the end portion P of the casing 22, the clamping portion 36 of the cover 26 could clamp the circuit board 24 cooperatively with the protruding portions 34. To be noted, in another embodiment, the casing 22 could directly utilize the end portion P to clamp the circuit board 24 cooperatively with the clamping portion 36 of the cover 26.

The drives 28 could be preferably a solid disk drive (but not limited thereto). The drives 28 could be inserted into the containing space 32 formed by the cover 26 and the casing 22 and could be plugged into the circuit board 24, so as to establish electrical connection and data transmission between the server 12 and the drives 28 when the drive module 14 is inserted into the extraction opening 16. As for the circuit connection design between the circuit board 24 and the server 12, the related description is omitted herein since it is commonly seen in the prior art. In practical application, two sides of the casing 22 could have a rail structure 38 formed thereon respectively, but not limited thereto, meaning that the drive module 14 could also adopt the design in which only one side of the casing 22 has the rail structure 38 formed thereon. Accordingly, the drives 28 could be inserted into the containing space 32 along the rail structure 38, so as to improve assembly convenience of the disk module 14.

Figure 4:
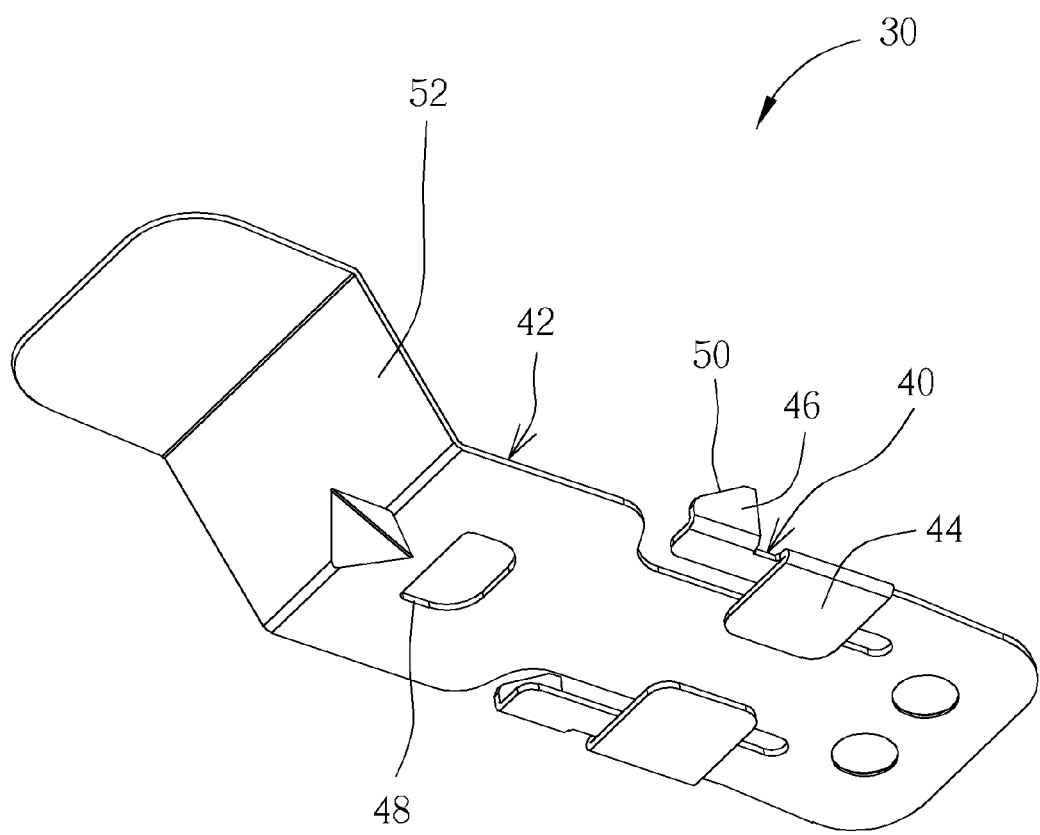
FIG. 4 is an enlarged diagram of a fixing member in FIG. 3 from another viewing angle.

Please refer to FIG. 3 and FIG. 4. FIG. 4 is an enlarged diagram of the fixing member 30 in FIG. 3 from another viewing angle. As shown in FIG. 3 and FIG. 4, the fixing member 30 could have at least one engaging arm 40 (two respectively shown in FIG. 3 and FIG. 4, but not limited thereto) and a pressing arm 42. The fixing member 30 is fixed on the casing 22. A support pad 44 extends from the engaging arm 40 for supporting the pressing arm 42 (as shown in FIG. 4). A clamping tooth 46 is formed on an end of the engaging arm 40 for clamping the circuit board 24. A second positioning portion 48 is formed on the pressing arm 42 for engaging with the first positioning portion 18 of the server 12 so as to fix the drive module 14 in the extraction opening 16. A conventional structural engagement design could be applied to engagement between the first positioning portion 18 and the second positioning portion 48, such as a concave-convex matching design. For example, as shown in FIG. 2, the first positioning portion 18 could be a protruding portion and the second positioning portion 48 could be a hole for engaging with the protruding portion, so that the drive module 14 could be fixed in the extraction opening 16. In practical application, an inclined surface 50 could be formed on the clamping tooth 46, so that the circuit board 24 could move along the inclined surface 50 to a position where the circuit board 24 is clamped by the clamping tooth 46 for making engagement of the clamping tooth 46 and the circuit board 24 more smooth. Furthermore, a bending handle 52 could extend from an end of the pressing arm 42 for a user to pull the fixing member 30 conveniently.

Figure 5:
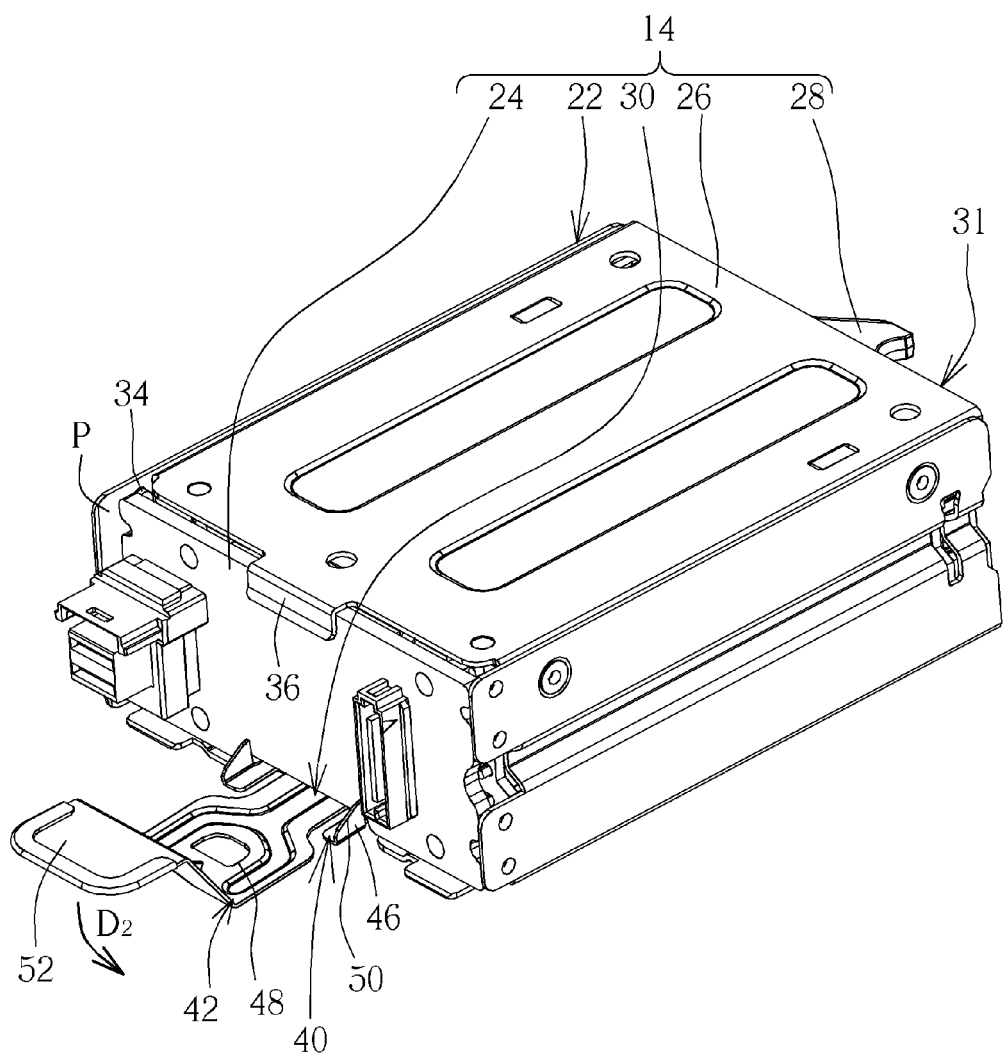
FIG. 5 is an assembly diagram of the drive module in FIG. 3.
Figure 6:
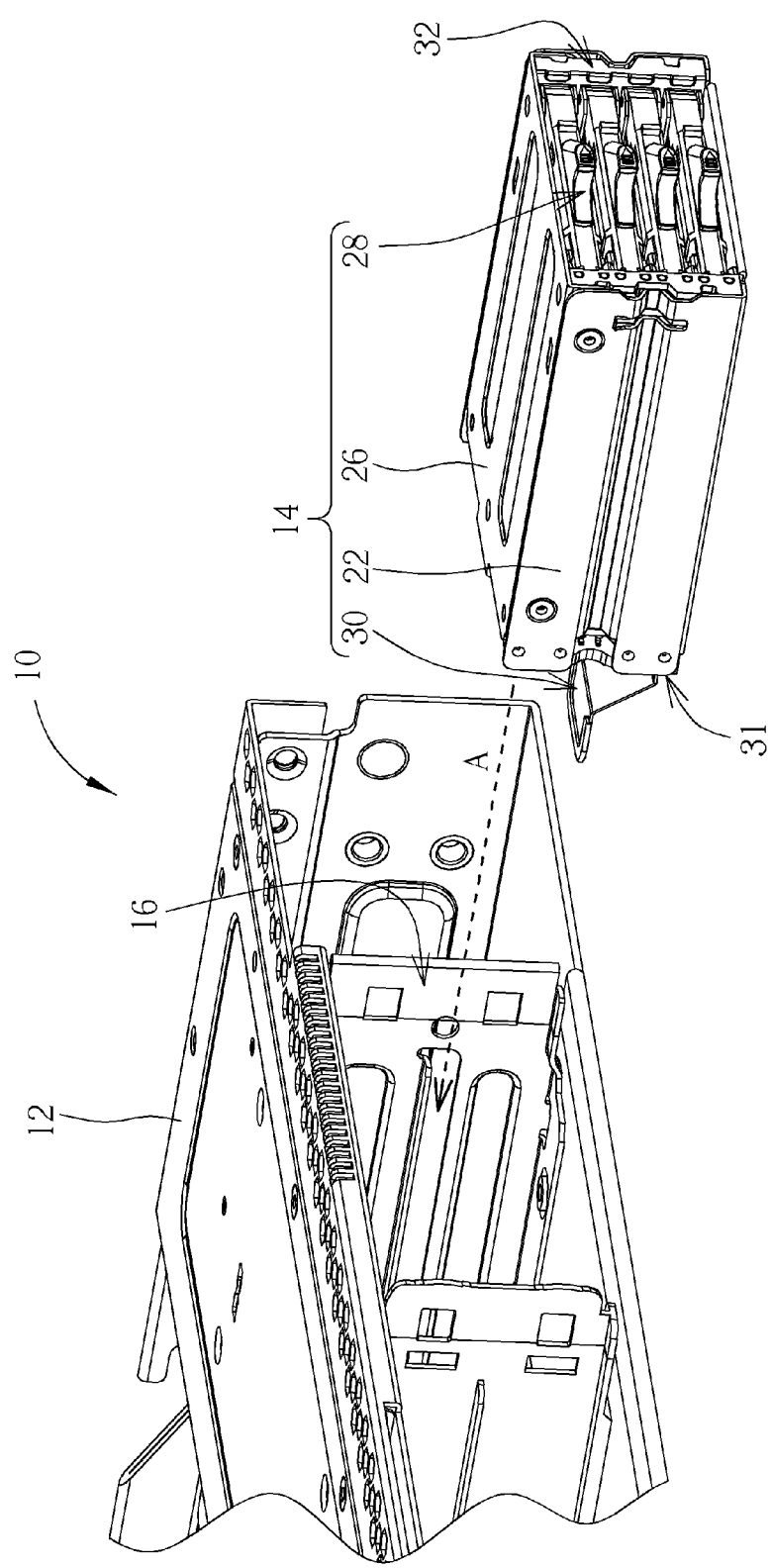
FIG. 6 is a diagram that the drive module in FIG. 5 has not been inserted into an extraction opening of a server yet.

More detailed description for the drive replacement operation and the drive disassembly operation of the server mechanism 10 is provided as follows. Please refer FIG. 1, FIG. 2, FIG. 5, and FIG. 6. FIG. 5 is an assembly diagram of the drive module 14 in FIG. 3. FIG. 6 is a diagram that the drive module 14 in FIG. 5 has not been inserted into the extraction opening 16 of the server 12 yet. The server 12 is briefly depicted by a part of its casing in FIG. 6. To be noted, in this embodiment, the drive replacement operation and the drive disassembly operation of the server mechanism 10 are described on condition that a user replaces two hard disk drives originally assembled in the extraction opening 16 with four modularized drives 28, but not limited thereto. For example, the present invention could be also suitable for replacing one hard disk drive originally assembled in the extraction opening 16 with two modularized drives 28. As for other derived embodiments, the related description could be reasoned by analogy and omitted herein.

When the user wants to assemble the drives 28 in the extraction opening 16 of the server 12 after extracting the aforesaid hard disk drives from the extraction opening 16, the user needs to modularize the drives 28 in advance. For example, after disposing the cover 26 on the casing 22 and fixing the fixing member 30 on the casing 22 (e.g. by screw or rivets), the user could insert the circuit board 24 between the clamping portion 36 of the cover 26 and the protruding portions 34 of the casing 22 from down to up, and then could push the circuit board 24 to press the clamping tooth 46 on the engaging arm 40 until the circuit board 24 moves along the inclined surface 50 on the clamping tooth 46 to a position where the circuit board 24 is clamped by the clamping tooth 46 (as shown in FIG. 5). Accordingly, the circuit board 24 could be clamped by the clamping portion 36 and the protruding portions 34 cooperatively and be clamped by the clamping tooth 46, so as to make the circuit board 24 disposed between the cover 26 and the casing 22 steadily. Subsequently, modularization of the drives 28 could be completed as long as the drives 28 are inserted into the containing space 32 along the rail structure 38 and are plugged into the circuit board 24 respectively.

Finally, the user could insert the modularized drive module 14 into the extraction opening 16 of the server 12 along an arrow A as shown in FIG. 6 until the protruding block 20 in the server 12 abuts against the casing 22 of the drive module 14. During this process, with inward movement of the drive module 14 relative to the extraction opening 16, the second positioning portion 48 on the pressing arm 42 of the fixing member 30 could be engaged with the first positioning portion 18 in the server 12 (as shown in FIG. 2) to fix the drive module 14 in the extraction opening 16, so as to complete the drive replacement operation of the server mechanism 10 (as shown in FIG. 1).

On the other hand, when the user wants to extract the drive module 14 as shown in FIG. 2 from the extraction opening 16 of the server 12, the user just needs to pull the bending handle 52 upward (i.e. toward a first direction $D_1$ as shown in FIG. 2) to make the second positioning portion 48 on the pressing arm 42 disengaged from the first positioning portion 18 in the server 12. At this time, since the second positioning portion 48 is no longer engaged with the first positioning portion 18, the user could pull the drive module 14 outward relative to the extraction opening 16 until the drive module 14 is separate from the extraction opening 16 completely. In such a manner, the user could extract the drive module 14 from the extraction opening 16 of the server 12 smoothly so as to complete the drive disassembly operation of the server mechanism 10.

To be noted, as shown in FIG. 4, when the user pulls the bending handle 52 of the pressing arm 42 upward, the engaging arm 40 would not be driven to move upward with the pressing arm 42 since the fixing member 30 adopts the design in which the pressing arm 42 is supported by the support pad 44 of the engaging arm 40. In such a manner, the present invention could make sure that the clamping tooth 46 on the engaging arm 40 could always clamp the circuit board 24 during the drive disassembly process of the drive module 14, and could also prevent damage of the circuit board 24 due to excessive pressing of the engaging arm 40 during the user pulls the bending handle 52 of the pressing arm 42 upward.

Furthermore, when the user wants to detach the circuit board 24 which has been separate from the drives 28 from the drive module 14, the user just needs to press the bending handle 52 as shown in FIG. 5 toward a direction opposite to the first direction $D_1$ as shown in FIG. 2 (i.e. toward a second direction $D_2$ as shown in FIG. 4). During this process, the pressing arm 42 could drive the clamping tooth 46 on the engaging arm 40 via the support pad 44 to be separate from the circuit board 24. At the same time, since the clamping tooth 46 on the engaging arm 40 no longer clamps the circuit board 24, the user could extract the circuit board 24 from the cover 26 and the casing 22 conveniently, and then could perform subsequent replacement or maintenance operation of the circuit board 24.

Compared with the prior art, the present invention adopts the drive modularization design to efficiently solve the prior art problem that the overall size of the small-size disk drives does not fit the size of the large-size disk drive. Accordingly, when a user wants to replace a large-size disk drive (e.g. a hard disk drive) originally assembled in the extraction opening of the server with plural small-size disk drives (e.g. solid state disk drives), the user could complete the drive replacement operation of the server mechanism quickly via the drive modularization design of the present invention. In such a manner, the present invention could greatly improve convenience of the server mechanism in the drive replacement operation and increase efficiency in use of space of the server mechanism.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A drive module detachably inserted into an extraction opening of a server, the server having a first positioning portion formed in the extraction opening, the drive module comprising:
    a casing;
    a circuit board abutting against an end portion of the casing;
    a cover disposed on the casing for forming a containing space cooperatively with the casing, the cover having a clamping portion formed thereon;
    a fixing member fixed on the casing, the fixing member having at least one engaging arm and a pressing arm, the at least one engaging arm being engaged with the circuit board for fixing the circuit board on the end portion of the casing when the clamping portion and the end portion of the casing clamp the circuit board cooperatively, a second positioning portion being formed on the pressing arm for engaging with the first positioning portion to fix the drive module in the extraction opening; and
    a plurality of drives inserted into the containing space and plugged into the circuit board;
    wherein the second positioning portion is disengaged from the first positioning portion to make the drive module detachably extracted from the extraction opening when the pressing arm is pulled toward a first direction relative to the casing, the pressing arm drives the engaging arm to be separate from the circuit board when the puling arm is pulled toward a second direction, and the first direction is opposite to the second direction.

2. The drive module of claim 1, wherein the end portion of the casing has at least one protruding portion formed thereon, and the at least one protruding portion abuts against the circuit board for clamping the circuit board cooperatively with the clamping portion.

3. The drive module of claim 1, wherein an end of the at least one engaging arm has a clamping tooth formed thereon for clamping the circuit board.

4. The drive module of claim 3, wherein an inclined surface is formed on the clamping tooth for guiding the circuit board to move along the inclined surface to a position where the circuit board is clamped by the clamping tooth.

5. The drive module of claim 1, wherein at least one side of the casing has a rail structure formed thereon so as to make the plurality of drives inserted into the containing space along the rail structure.

6. The drive module of claim 1, wherein a bending handle extends from one end of the pressing arm.

7. The drive module of claim 1, wherein a support pad extends from the at least one engaging arm for supporting the pressing arm.

8. A server mechanism comprising:
    a server having an extraction opening and a first positioning portion formed in the extraction opening; and
    a drive module detachably inserted into the extraction opening of the server, the drive module comprising:
        a casing;
        a circuit board abutting against an end portion of the casing;
        a cover disposed on the casing for forming a containing space cooperatively with the casing, the cover having a clamping portion formed thereon;

a fixing member fixed on the casing, the fixing member having at least one engaging arm and a pressing arm, the at least one engaging arm being engaged with the circuit board for fixing the circuit board on the end portion of the casing when the clamping portion and the end portion of the casing clamp the circuit board cooperatively, a second positioning portion being formed on the pressing arm for engaging with the first positioning portion to fix the drive module in the extraction opening; and a plurality of drives inserted into the containing space and plugged into the circuit board;

wherein the second positioning portion is disengaged from the first positioning portion to make the drive module detachably extracted from the extraction opening when the pressing arm is pulled toward a first direction relative to the casing, the pressing arm drives the engaging arm to be separate from the circuit board when the puling arm is pulled toward a second direction, and the first direction is opposite to the second direction.

9. The server mechanism of claim 8, wherein the end portion of the casing has at least one protruding portion formed thereon, and the at least one protruding portion abuts against the circuit board for clamping the circuit board cooperatively with the clamping portion.

10. The server mechanism of claim 8, wherein an end of the at least one engaging arm has a clamping tooth formed thereon for clamping the circuit board.

11. The server mechanism of claim 10, wherein an inclined surface is formed on the clamping tooth for guiding the circuit board to move along the inclined surface to a position where the circuit board is clamped by the clamping tooth.

12. The server mechanism of claim 8, wherein at least one side of the casing has a rail structure formed thereon so as to make the plurality of drives inserted into the containing space along the rail structure.

13. The server mechanism of claim 8, wherein a bending handle extends from one end of the pressing arm.

14. The server mechanism of claim 8, wherein the server further has a protruding block formed in the extraction opening, and the protruding block abuts against the casing for constraining inward movement of the drive module relative to the extraction opening when the drive module is inserted into the extraction opening.

15. The server mechanism of claim 8, wherein a support pad extends from the at least one engaging arm for supporting the pressing arm.

16. A containing frame detachably inserted into an extraction opening of a server for containing a plurality of drives, the plurality of drives being plugged into a circuit board, the server having a first positioning portion formed in the extraction opening, the containing frame comprising:

a casing, the circuit board abutting against an end portion of the casing;

a cover disposed on the casing for forming a containing space cooperatively with the casing, the cover having a clamping portion formed thereon; and a fixing member fixed on the casing, the fixing member having at least one engaging arm and a pressing arm, the at least one engaging arm being engaged with the circuit board for fixing the circuit board on the end portion of the casing when the clamping portion and the end portion of the casing clamp the circuit board cooperatively, a second positioning portion being formed on the pressing arm for engaging with the first positioning portion to fix the drive module in the extraction opening;

wherein the second positioning portion is disengaged from the first positioning portion to make the containing frame with the plurality of drives detachably extracted from the extraction opening when the pressing arm is pulled toward a first direction relative to the casing, the pressing arm drives the engaging arm to be separate from the circuit board when the puling arm is pulled toward a second direction, and the first direction is opposite to the second direction.

17. The containing frame of claim 16, wherein the end portion of the casing has at least one protruding portion formed thereon, and the at least one protruding portion abuts against the circuit board for clamping the circuit board cooperatively with the clamping portion.

18. The containing frame of claim 16, wherein an end of the at least one engaging arm has a clamping tooth formed thereon for clamping the circuit board, and an inclined surface is formed on the clamping tooth for guiding the circuit board to move along the inclined surface to a position where the circuit board is clamped by the clamping tooth.

19. The containing frame of claim 16, wherein at least one side of the casing has a rail structure formed thereon so as to make the plurality of drives inserted into the containing space along the rail structure.

20. The containing frame of claim 16, wherein a bending handle extends from one end of the pressing arm.

* * * * *